United States Patent
Wei

(10) Patent No.: US 7,262,660 B2
(45) Date of Patent: Aug. 28, 2007

(54) VARIABLE GAIN AMPLIFIER HAVING LINEAR-IN-DECIBEL TRANSCONDUCTANCE

(75) Inventor: Hu Wei, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/654,818

(22) Filed: Jan. 18, 2007

(65) Prior Publication Data

US 2007/0115058 A1    May 24, 2007

Related U.S. Application Data

(62) Division of application No. 11/069,816, filed on Mar. 1, 2005, now Pat. No. 7,183,849.

(30) Foreign Application Priority Data

Mar. 2, 2004    (KR) .................................. 04-13915

(51) Int. Cl.
  *H03F 3/45* (2006.01)
(52) U.S. Cl. ..................................... 330/254
(58) Field of Classification Search .................. 330/254
  See application file for complete search history.

(56) References Cited

U.S. PATENT DOCUMENTS

| 4,859,961 A | 8/1989 | Davenport |
|---|---|---|
| 5,006,816 A | 4/1991 | Koide |
| 5,999,053 A | 12/1999 | Eschauzier |
| 6,366,168 B1 | 4/2002 | Zheng et al. |
| 6,788,144 B2 * | 9/2004 | Honda ........................ 330/254 |
| 6,933,783 B2 | 8/2005 | Banba |
| 7,081,785 B2 | 7/2006 | Mori et al. |
| 7,151,409 B2 * | 12/2006 | Koen et al. ................. 330/254 |
| 2003/0132803 A1 | 7/2003 | Matsumoto et al. |

FOREIGN PATENT DOCUMENTS

| JP | 3-38919 | 2/1991 |
|---|---|---|
| JP | 5-29856 | 2/1993 |
| JP | 2001-196880 | 7/2001 |

* cited by examiner

*Primary Examiner*—Robert Pascal
*Assistant Examiner*—Alan Wong
(74) *Attorney, Agent, or Firm*—Mills & Onello LLP

(57) ABSTRACT

A variable gain amplifier includes a variable resistor, a first MOS transistor and a second MOS transistor. The variable resistor has one end coupled to a ground. The first MOS transistor with transconductance 2gm amplifies a first differential input signal to provide a first current between an output node and other end of the variable resistor. The second MOS transistor with transconductance gm amplifies a second differential input signal to provide a second current between the output node and the ground. The variable resistor can be implemented using a MOS transistor operating in a linear region. The variable gain amplifier has an exponentially varying output current responsive to adjusting a gate voltage of the MOS transistor. Therefore, the transconductance of the variable gain amplifier has a linear-in-decibel characteristic.

13 Claims, 7 Drawing Sheets

US 7,262,660 B2

VARIABLE GAIN AMPLIFIER HAVING LINEAR-IN-DECIBEL TRANSCONDUCTANCE

CLAIM FOR PRIORITY

This application is a divisional of U.S. application Ser. No. 11/069,816, filed on Mar. 1, 2005, now U.S. Pat. No. 7,183,849 which relies for priority upon Korean Patent Application No. 10-2004-0013915, filed on Mar. 2, 2004, the contents of which are herein incorporated by reference in their entirety.

BACKGROUND OF THE INVENTION

1. Field of the Invention

The present invention relates to a variable gain amplifier, and more particularly to a variable gain amplifier having linear-in-decibel transconductance.

2. Description of the Related Art

An exponential gain characteristic is required in many automatic gain control (AGC) applications. In order to obtain the exponential gain characteristic, a bipolar semiconductor process and a bipolar complementary metal oxide semiconductor (BICMOS) process have been widely used. A variable gain amplifier, which has a linear-in-dB gain characteristic, manufactured by a bipolar semiconductor process, is disclosed in U.S. Pat. No. 5,999,053, which is entitled "Current Steering Variable Gain Amplifier With Linearizer". In recent years, a CMOS process has been widely used in designing integrated circuits, thus, designing amplifiers with exponential gain characteristics using the CMOS process has also been necessary. Although a MOS transistor has no inherent exponential transmission characteristic, a circuit having linear-in-decibel gain characteristic may be implemented using a CMOS process by applying the Taylor series expansion, $\exp(-2x) \cong (1-x)/(1+x)$ so as to approximate the linear-in-decibel gain characteristic.

SUMMARY OF THE INVENTION

Accordingly, the present invention is provided to substantially obviate one or more problems due to limitations and disadvantages of the related art.

It is a first feature of the present invention to provide a variable gain amplifier having linear-in-decibel transconductance.

It is a second feature of the present invention to provide a voltage-current converter having linear-in-decibel transconductance.

According to one aspect, the invention is directed to a variable gain amplifier which includes a variable resistor, a first MOS transistor and a second MOS transistor. The variable resistor has one end coupled to ground. The first MOS transistor amplifies a first differential input signal to provide a first current between an output node and the other end of the variable resistor, and the first MOS transistor has a first transconductance. The second MOS transistor amplifies a second differential input signal to provide a second current between the output node and ground, the second MOS transistor having a second transconductance of gm. The first transconductance is two times the first transconductance gm.

In one embodiment, the first differential input signal is a positive differential input signal, and the second differential input signal is a negative differential input signal. A load resistor can be coupled between a power supply voltage and the output node. The variable gain amplifier can have an exponentially varying transconductance by linearly adjusting resistance of the variable resistor. A size of the first MOS transistor is about two times as large as a size of the second MOS transistor. The first MOS transistor and the second MOS transistor can include an N-type MOS transistor. The variable resistor can be implemented using an MOS transistor. The MOS transistor can operate in a deep triode region. The MOS transistor can operate in a linear region. The variable gain amplifier can have an exponentially varying output current by adjusting a gate voltage of the MOS transistor.

In accordance with another aspect, the invention is directed to a variable gain amplifier which includes a first MOS transistor, a first current source, a second MOS transistor, a third MOS transistor, a second current source, a fourth MOS transistor, a third current source and a variable resistor. The first MOS transistor has a gate to which a positive differential input signal is applied and has a drain coupled to a first output node. The first current source is coupled between a source of the first MOS transistor and a ground, and provides a first current. The second MOS transistor has a gate to which the positive differential input signal is applied and has a drain coupled to a second output node. The third MOS transistor has a gate to which a negative differential input signal is applied and has a drain coupled to the first output node. The second current source is coupled between the ground and a junction of a source of the second MOS transistor and a source of the third MOS transistor, and provides a second current I. The fourth MOS transistor has a gate to which the negative differential input signal is applied and has a drain coupled to the second output node. The third current source is coupled between a source of the fourth MOS transistor and the ground, and provides a third current defined by 2×I. The variable resistor is coupled between the first MOS transistor and the fourth MOS transistor. The first current is defined as 2×I.

In one embodiment, a first load resistor is coupled between a power supply voltage and the first output node, and a second load resistor is coupled between the power supply voltage and the second output node. In one embodiment, transconductance values of the second and third MOS transistors are approximately equal to each other, and transconductance values of the first and fourth MOS transistors are about two times as large as the transconductance value of the second MOS transistor. The variable resistor can be implemented using at least one MOS transistor. In one embodiment, the at least one MOS transistor implemented as the variable resistor operates in a linear region. The variable gain amplifier can have an exponentially varying transconductance responsive to adjusting a control voltage applied to a gate of the at least one MOS transistor. In one embodiment, the first, second, third and fourth MOS transistors have approximately the same transistor size.

In accordance with another aspect, the invention is directed to a variable gain amplifier which includes a first MOS transistor, a first current source, a second MOS transistor, a third MOS transistor, a second current source, a fourth MOS transistor, a third current source and a variable resistor. The first MOS transistor has a gate to which a positive differential input signal is applied and has a drain coupled to a first output node, and the first MOS transistor has a size of 4×W/L, W representing a width of a channel of the first MOS transistor, and L representing a length of the channel. The first current source is coupled between a source of the first MOS transistor and a ground, and provides a current I. The second MOS transistor has a gate to which the positive differential input signal is applied and has a drain coupled to a second output node, and the second MOS transistor has a size of 1W/L. The third MOS transistor has a gate to which a negative differential input signal is applied and has a drain coupled to the first output node, and the third MOS transistor has the size of 1W/L. The second current source is coupled between the ground and a junction of a source of the second MOS transistor and a source of the third MOS, and provides a current 2×I. The fourth MOS transistor has a gate to which the negative differential input signal is applied and has a drain coupled to the second output node, and the fourth MOS transistor has a size of 4×W/L. The third current source is coupled between the fourth MOS transistor and the ground, and provides the current I. The variable resistor is coupled between the first MOS transistor and the fourth MOS transistor.

In one embodiment, a first load resistor is coupled between a power supply voltage and the first output node, and a second load resistor is coupled between the power supply voltage and the second output node. In one embodiment, transconductance values of the second and third MOS transistors are approximately equal to each other, and transconductance values of the first and fourth MOS transistors are about two times as large as the transconductance value of the second MOS transistor. In one embodiment, the variable resistor is implemented using at least one MOS transistor. In one embodiment, the at least one MOS transistor implemented as the variable resistor operates in a linear region. In one embodiment, the variable gain amplifier has an exponentially varying transconductance responsive to adjusting a control voltage applied to a gate of the at least one MOS transistor implemented as the variable resistor.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
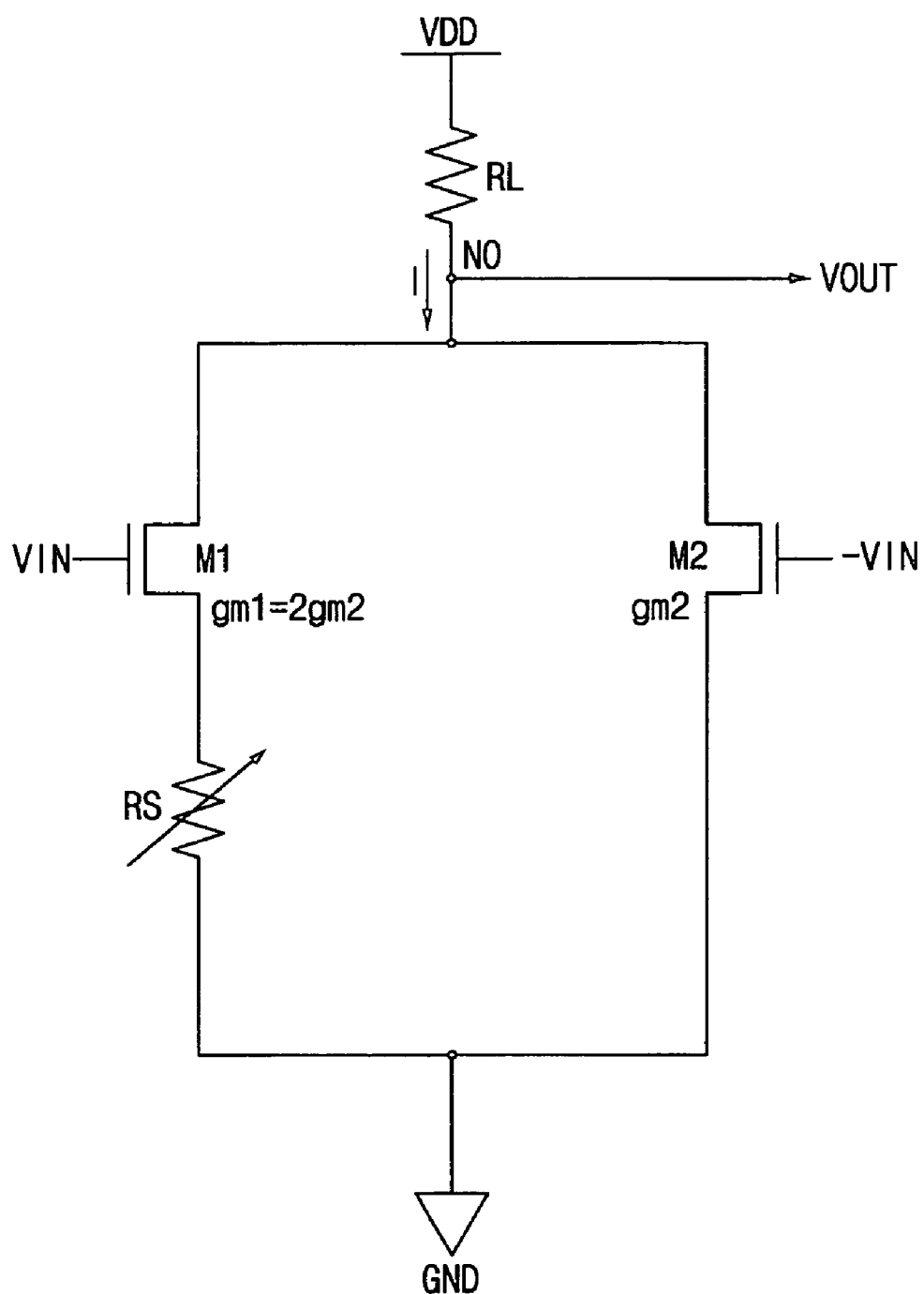
FIG. 1 is a circuit diagram illustrating a variable gain amplifier having a source resistor according to a first exemplary embodiment of the present invention.

FIG. 1 is a circuit diagram illustrating a variable gain amplifier having a source resistor according to a first exemplary embodiment of the present invention.

Referring to FIG. 1, the variable gain amplifier includes NMOS (N-type Metal Oxide Semiconductor) transistors M1 and M2, a variable source resistor RS and a load resistor RL.

In addition, the transconductance of the NMOS transistor M1 is about two times as large as the transconductance of the NMOS transistor M2, i.e., gm1=2×gm2.

The NMOS transistor M1 amplifies a positive differential input signal VIN to generate an amplified output at an output node N0. The variable source resistor RS couples a source of the NMOS transistor M1 to ground voltage GND. The NMOS transistor M2 amplifies a negative differential input signal −VIN to generate an amplified output at the output node N0. The load resistor RL couples a power supply voltage VDD to the output node N0 that produces an output voltage VOUT.

Figure 2:
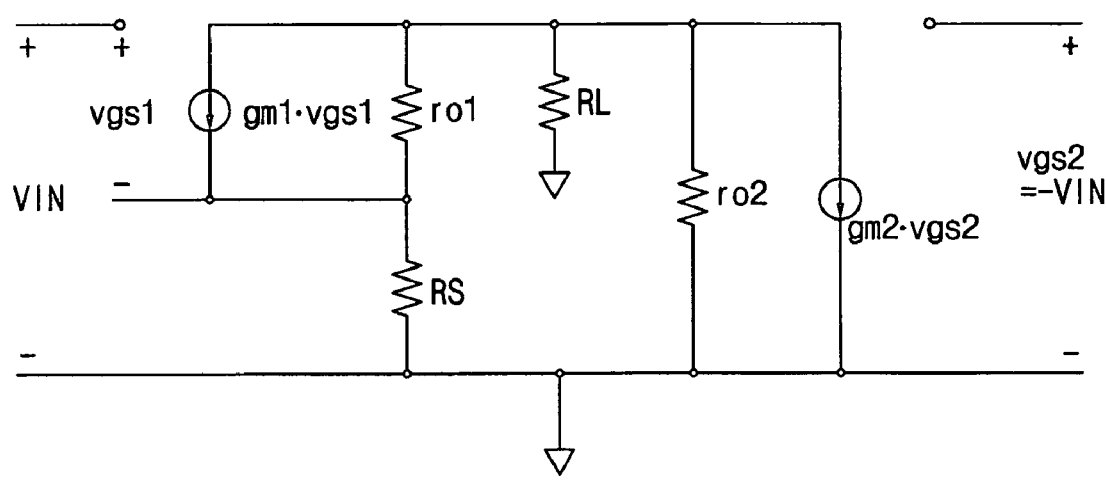
FIG. 2 is a circuit diagram illustrating a small signal model of the variable gain amplifier shown in FIG. 1.
Figure 3:
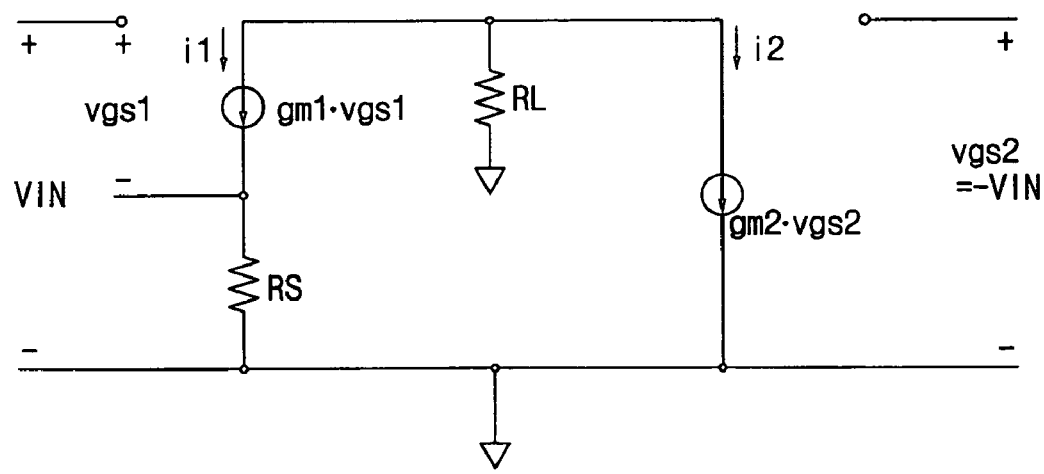
FIG. 3 is a simplified circuit diagram illustrating the small signal model shown in FIG. 2.

FIG. 2 is a circuit diagram illustrating a small signal model of the variable gain amplifier shown in FIG. 1. As for the small signal model of FIG. 2, vgs1 is a gate-to-source voltage of the NMOS transistor M1, gm1 is a transconductance of the NMOS transistor M1, and ro1 is an output resistor of the NMOS transistor M1. Similarly, vgs2 is a gate-to-source voltage of the NMOS transistor M2, gm2 is a transconductance of the NMOS transistor M2, and ro2 an output resistor of the NMOS transistor M2. FIG. 3 is a simplified circuit diagram illustrating the small signal model shown in FIG. 2. The effect of channel length modulation is negligible in the MOS transistor, thus the output resistors ro1 and ro2 of the respective MOS transistors M1 and M2 in FIG. 2 may be disregarded as shown in FIG. 3.

Hereinafter, with reference to FIGS. 1 through 3, a variable gain amplifier having a source resistor will be described according to a first exemplary embodiment of the present invention.

Referring to FIG. 3, transconductance of the circuit in FIG. 1 is calculated according to the following procedure.

Because VIN=vgs1+RS×i1, i1 and i2 in FIG. 3 are expressed by the following expressions 1 and 2.

$$i1 = gm1 \times (VIN - RS \times i1) \qquad \text{<Expression 1>}$$

$$i2 = -gm2 \times VIN \qquad \text{<Expression 2>}$$

The expression 1 can be rewritten using expression 3.

$$i1 = (gm1/(1+gm1 \times RS)) \times VIN \qquad \text{<Expression 3>}$$

The current I flowing through the NMOS transistors M1 and M2 is equal to 'i1+i2', and can be expressed by expression 4.

$$I = \frac{gm1}{1+gm1 \times RS} \times VIN - gm2 \times VIN \qquad \text{<Expression 4>}$$

Since gm2=gm1/2, the expression 4 can be rewritten as expression 5.

$$I = \frac{gm1}{1+gm1 \times RS} \times VIN - \frac{gm1}{2} \times VIN \qquad \text{<Expression 5>}$$

Overall transconductance value of the variable gain amplifier illustrated in FIG. 1 is represented by expression 6.

$$Gm = I/VIN = \frac{gm1 - \frac{gm1}{2} \times (1 + gm1 \times RS)}{1 + gm1 \times RS} \qquad \text{<Expression 6>}$$

The expression 6 can be rewritten as expression 7.

$$Gm = \frac{gm1}{2} \times \frac{1 - gm1 \times RS}{1 + gm1 \times RS} \qquad \text{<Expression 7>}$$

Based on the Taylor series expansion, an approximation $\exp(-2x)=(1-x)/(1+x)$ can be used. Therefore, $(1-gm1\times RS)/(1+gm1\times RS)$ in expression 7, can be approximated to $\exp(-2\times gm1\times RS)$. As a result, a circuit with the architecture in FIG. 1 provides a transconductance having an exponential function characteristic.

Referring to expression 7, by linearly varying the resistance of the variable source resistor RS, an exponentially varying current may be generated in the load RL.

That is, the variable gain amplifier of FIG. 1 has linear-in-decibel transconductance.

Figure 4:
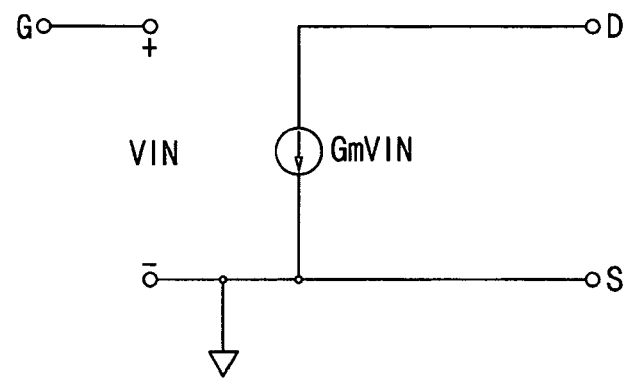
FIG. 4 is a circuit diagram illustrating an equivalent small signal model when the variable gain amplifier shown in FIG. 1 is considered as one MOS transistor.

FIG. 4 is a circuit diagram illustrating an equivalent small signal model when the variable gain amplifier shown in FIG. 1 is considered as one MOS transistor.

The Gm in FIG. 4 is equal to the Gm in expression 7.

Figure 5:
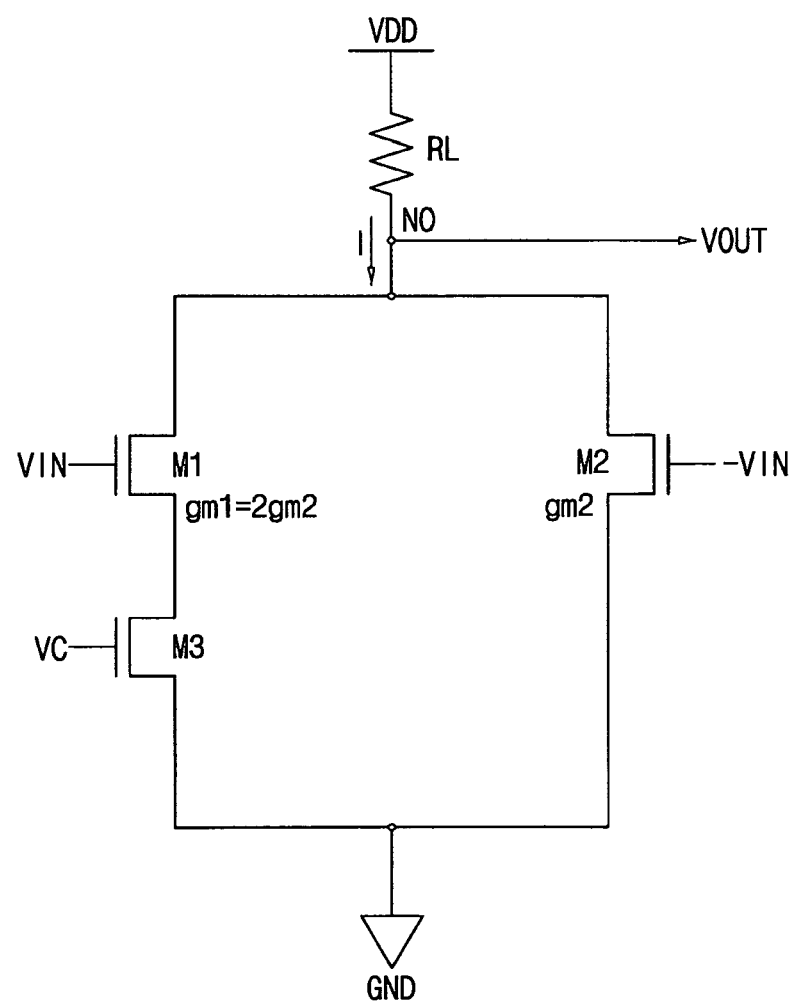
FIG. 5 is a circuit diagram illustrating the variable gain amplifier shown in FIG. 1, of which the source resistor is implemented using a MOS transistor that operates in a linear region.

FIG. 5 is a circuit diagram illustrating the variable gain amplifier shown in FIG. 1, of which source resistor is implemented using a MOS transistor that operates in a linear region.

The transconductance of the NMOS transistor M1 is about two times as large as the transconductance of the NMOS transistor M2.

Figure 6:
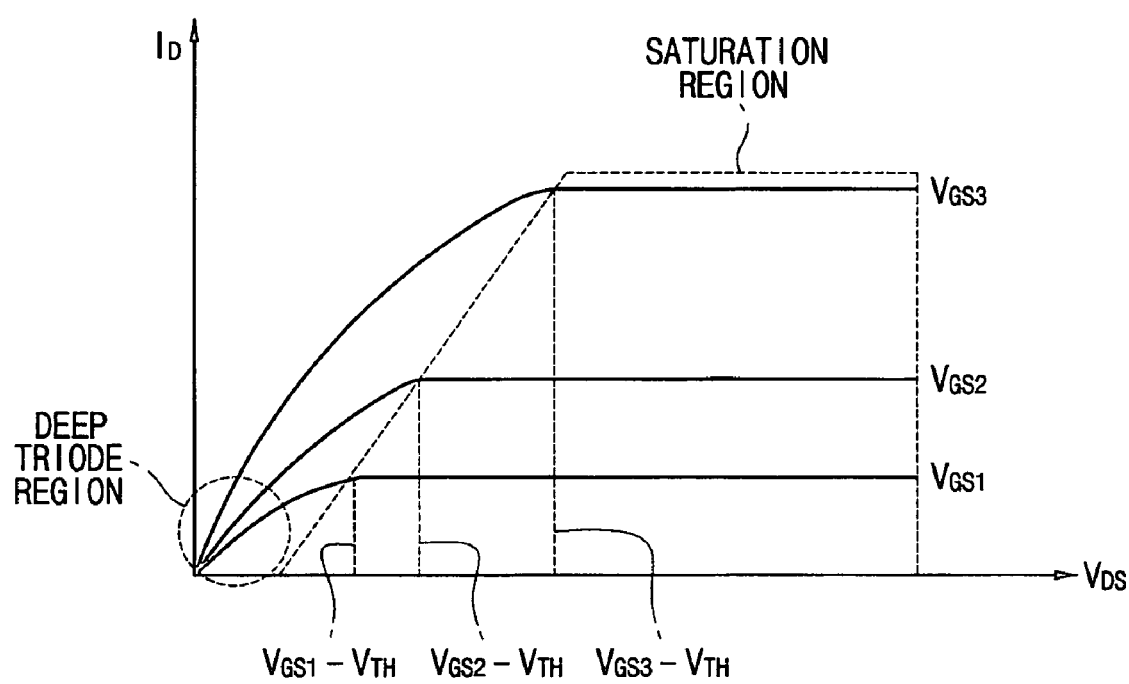
FIG. 6 is a graph illustrating $V_{DS}$-$I_D$ characteristics of a MOS transistor.

FIG. 6 is a graph illustrating $V_{DS}$-$I_D$ characteristics of a MOS transistor.

Generally, the current-voltage relation of the MOS transistor is represented by the following expression 8.

In expression 8, Id denotes a drain current, un an electron mobility, Cox a capacitance of a gate oxide layer, W a width of a gate region and L a length of a gate region of the MOS transistor, respectively.

Similarly, Vgs denotes gate-to-source voltage, Vth a threshold voltage and Vds drain-to-source voltage of the MOS transistor, respectively.

$$Id = un \times Cox \times \frac{W}{L} \times \left((Vgs - Vth) \times Vds - \frac{1}{2} \times Vds^2\right) \qquad \text{<Expression 8>}$$

When the MOS transistor operates in a deep triode region, that is, $Vds \ll 2(Vgs-Vth)$, expression 8 is rewritten as the following expression 9.

$$Id = un \times Cox \times \frac{W}{L} \times (Vgs - Vth) \times Vds \qquad \text{<Expression 9>}$$

An on-resistance Ron of the MOS transistor is represented by the following expression 10.

$$Ron = Id/Vds = \frac{1}{un \times Cox \times \frac{W}{L} \times (Vgs - Vth)} \qquad \text{<Expression 10>}$$

As shown in expression 10, when the MOS transistor operates in the deep triode region, the MOS transistor may be regarded as a resistor controlled by the gate-to-source voltage Vgs. Referring to FIG. 6, the deep triode region where the MOS transistor operates as a resistor is illustrated.

Referring back to FIG. 5, when the control voltage VC is properly adjusted in the range of the deep triode region of the MOS transistor M3, the variable gain amplifier may have an exponentially varying transconductance.

When the denominator and numerator in expression 7 representing the transconductance Gm of the variable gain amplifier of FIG. 1 are divided by gm1×RS, the expression 7 can be rewritten as the following expression 11.

$$Gm = \frac{-gm1}{2} \times \frac{1 - \frac{1}{gm1 \times RS}}{1 + \frac{1}{gm1 \times RS}} \qquad \text{<Expression 11>}$$

Substituting the source resistor RS in expression 11 with the on-resistance Ron in expression 10, the expression 11 can be represented as the following expression 12.

In expression 12, α is a constant and equal to (un×Cox×W)/(gm1×L).

$$Gm = \frac{-gm1}{2} \times \frac{1 - \alpha(Vgs - Vth)}{1 + \alpha(Vgs - Vth)} \qquad \text{<Expression 12>}$$

Accordingly, the variable gain amplifier of FIG. 3 may have an exponentially varying output current by controlling the gate voltage of the MOS transistor.

In the exemplary embodiments of FIGS. 1 and 5, the variable gain amplifier is implemented using NMOS transistors. Alternatively, the variable gain amplifier may also be implemented using PMOS transistors.

Figure 7:
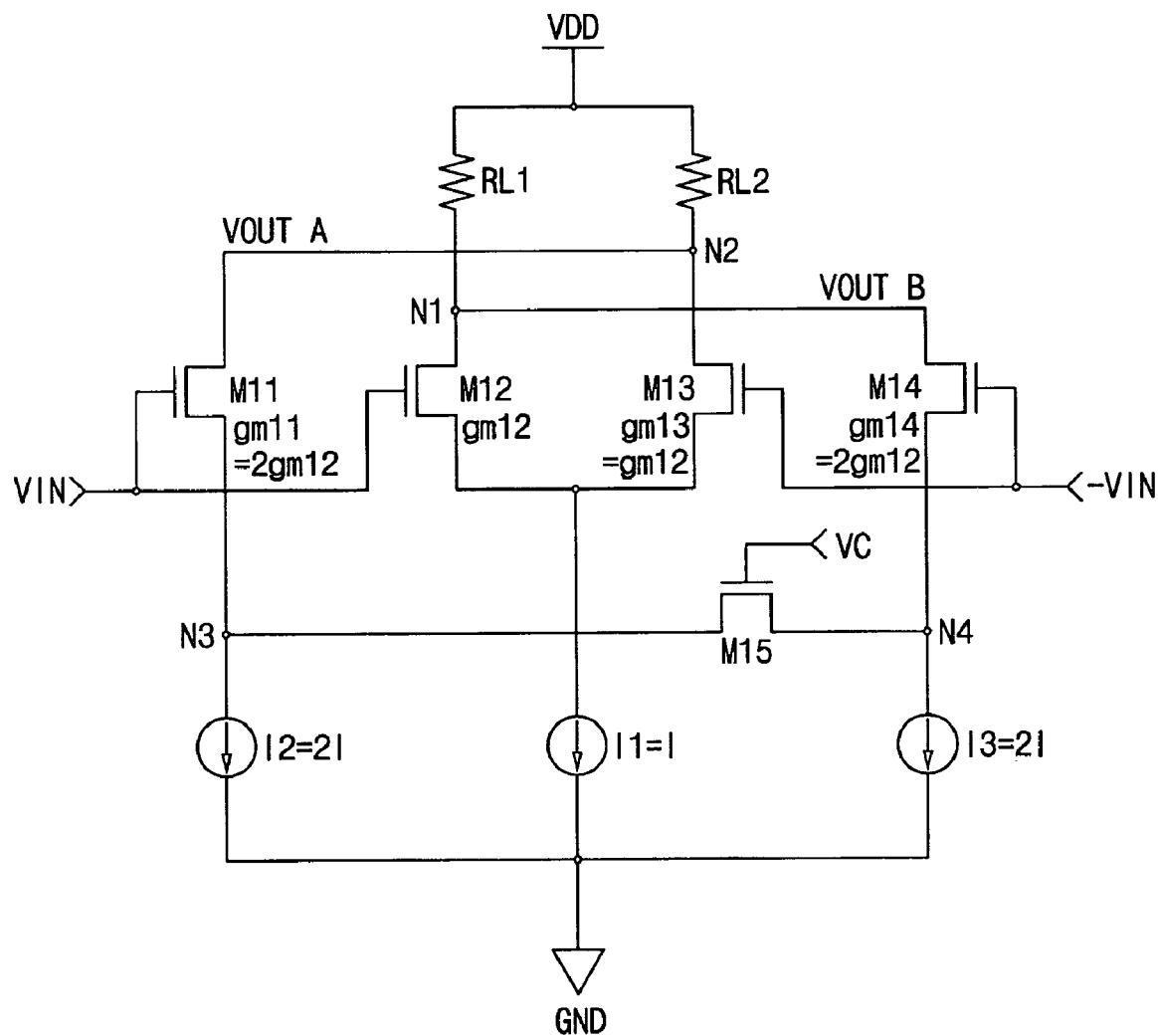
FIG. 7 is a circuit diagram illustrating a variable gain amplifier with a source resistor according to a second exemplary embodiment of the present invention.

In FIG. 7, a variable gain amplifier with a source resistor according to a second exemplary embodiment of the present invention has differential input voltages VIN and −VIN, and also has differential output voltages VOUTA and VOUTB.

A circuit structure in FIG. 7 corresponds to the circuit structure that is obtained by combining two variable gain amplifier circuits of FIG. 1.

Referring to FIG. 7, the variable gain amplifier includes NMOS transistors M11, M12, M13 and M14, current sources I1, I2 and I3, a MOS transistor M15 and load resistors RL1 and RL2.

The NMOS transistor M11 has a gate to which a positive differential input signal VIN is applied and has a drain coupled to an output node N2.

The current source I2 providing current 2I is coupled between a source of the NMOS transistor M11 and ground voltage GND.

The NMOS transistor M12 has a gate to which the positive differential input signal VIN is applied and has a drain coupled to an output node N1.

The NMOS transistor M13 has a gate to which a negative differential input signal −VIN is applied and has a drain coupled to the output node N2.

The current source I1 providing current I is coupled between the ground voltage GND and a junction or node between a source of the NMOS transistor M13 and a source of the NMOS transistor M12.

The NMOS transistor M14 has a gate to which the negative differential input signal −VIN is applied and has a drain coupled to the output node N1.

The current source I3 providing current 2I is coupled between a source of the NMOS transistor M14 and the ground voltage GND.

The NMOS transistor M15 operating as a variable resistor is placed between a node N3 and node N4.

Hereinafter, with reference to FIG. 7, the operation of the variable gain amplifier according to the second exemplary embodiment of the present invention is described.

The variable gain amplifier in FIG. 7 has differential input voltages and differential output voltages.

The following expression 13 represents the transconductance of a MOS transistor.

$$gm = \sqrt{2u_n \times C_{ox}} \sqrt{W/L} \sqrt{I_d} \qquad \text{<Expression 13>}$$

According to expression 13, gm is proportional to $(I_d)^{1/2}$. As a result, a drain current level of the NMOS transistor M11 should be four times as large as a drain current level of the NMOS transistor M12 so that the gm of the NMOS transistor M11 may be about two times as large as the gm of the NMOS transistor M12.

Similarly, a drain current level of the NMOS transistor M14 should be four times as large as a drain current level of the NMOS transistor M13.

The drain current level of the NMOS transistor M12 is equal to the drain current level of the NMOS transistor M13.

In order to satisfy the conditions mentioned above, the current source I1 providing current I is coupled between a ground and a junction of the source of the NMOS transistor M12 and the source of the NMOS transistor M13. Similarly, the current sources I2 and I3 each providing current of 2I are coupled to each of the sources of the NMOS transistors M11 and M14, respectively.

The variable gain amplifier of FIG. 7 with the gm value shown in expression 12 can vary output current of the variable gain amplifier exponentially by adjusting the gate voltage of the NMOS transistor M15.

Figure 8:
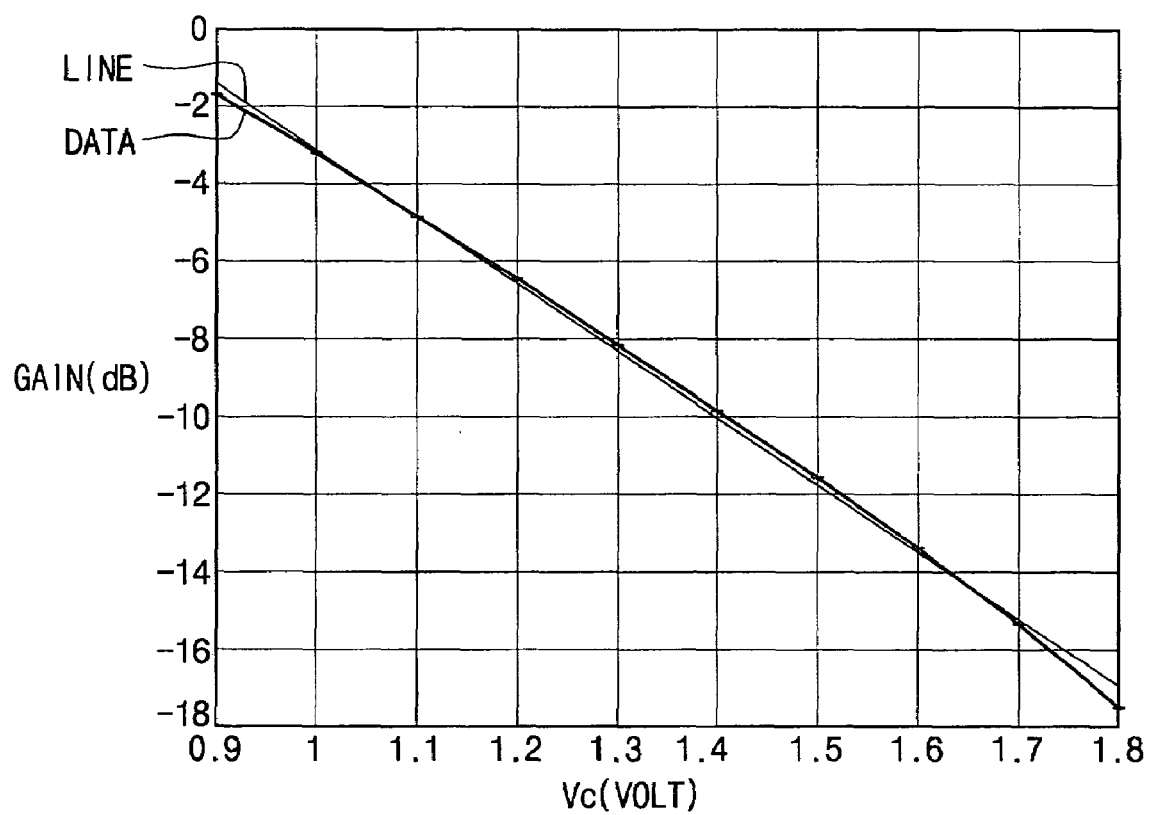
FIG. 8 is a graph illustrating linear dB gain characteristics of the variable gain amplifier shown in FIG. 7.

FIG. 8 is a graph illustrating linear dB gain characteristics of the variable gain amplifier shown in FIG. 7.

The graph in FIG. 8 shows variation of dB gain of the variable gain amplifier by adjusting the control voltage VC of the NMOS transistor M15 in the deep triode region.

Referring to FIG. 8, DATA denotes a gain represented by decibel (dB) according to simulation results, and LINE denotes a straight line for reference.

As illustrated in FIG. 8, the dB gain of the variable gain amplifier of FIG. 7 nearly linearly varies responsive to adjusting the control voltage VC of the NMOS transistor M15.

Figure 9:
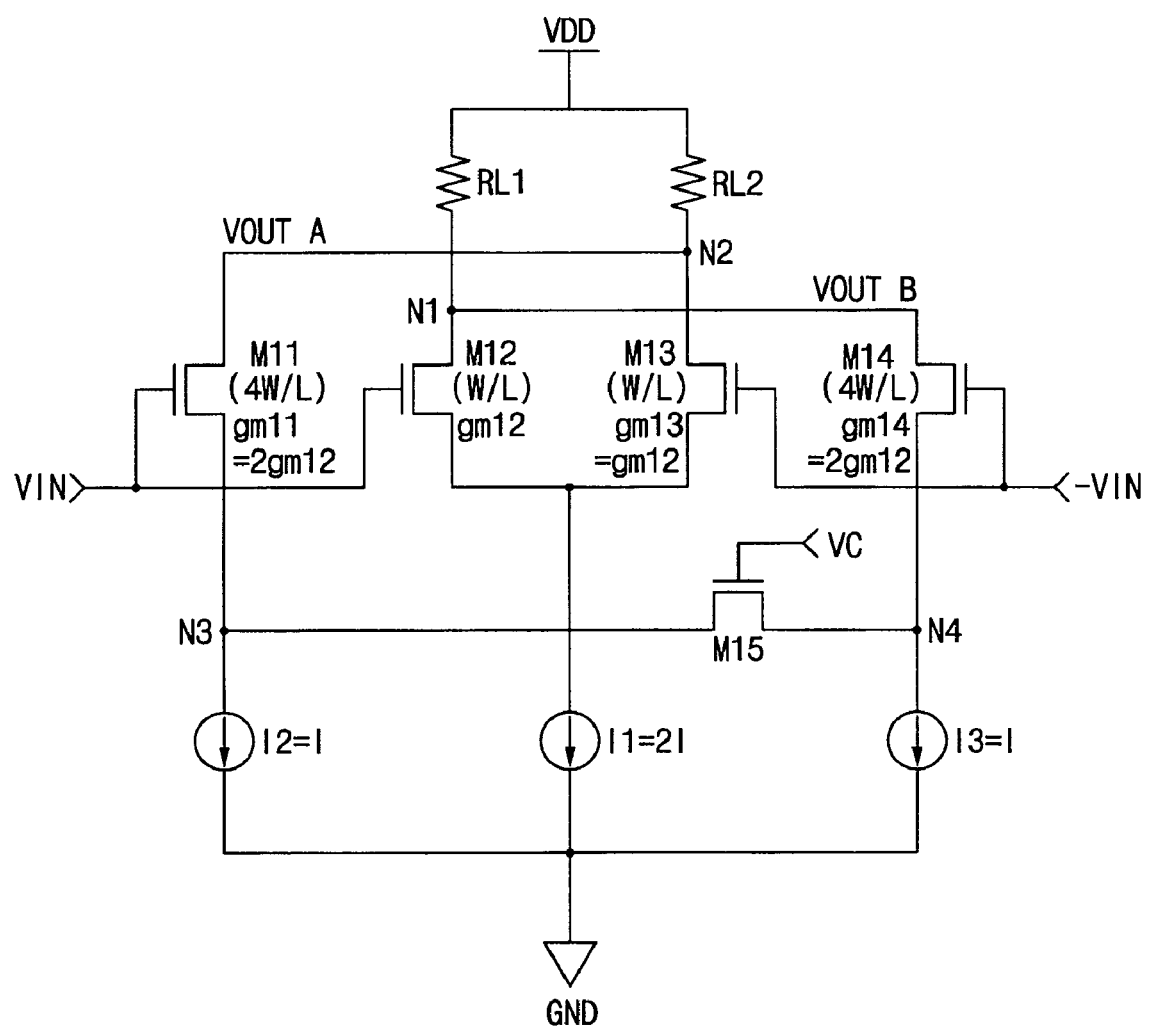
FIG. 9 is a circuit diagram illustrating a variable gain amplifier having a source resistor according to a third exemplary embodiment of the present invention.

FIG. 9 is a circuit diagram illustrating a variable gain amplifier with a source resistor according to a third exemplary embodiment of the present invention.

The variable gain amplifier of FIG. 9 differs from the variable gain amplifier of FIG. 7 in that the gm values of the MOS transistors M11, M12, M13 and M14 are determined based on the transistor size of the transistors M11, M12, M13 and M14. The gm values of the MOS transistors M11, M12, M13 and M14 of FIG. 7 is determined based on the level of drain currents Id in the variable gain amplifier of FIG. 7. However, each level of the drain currents flowing through the MOS transistors M11, M12, M13 and M14 of the variable gain amplifier in FIG. 9 is equal.

Referring to the expression 13, gm is proportional to $(W/L)^{1/2}$. As a result, in order to meet the condition described above, the level of current source I2 is I, the level of current source I1 is 2×I and the level of current source I3 is I.

Each size of the NMOS transistors M12 and M13 is designed to have a ratio of W/L (Width/Length), while each size of the NMOS transistors M11 and M14 is designed to have the ratio of 4×W/L.

Referring to FIG. 9, when the control voltage Vc provided to the gate of the NMOS transistor M15 operating in the deep triode region is linearly changed, the variable gain amplifier has an exponentially varying transconductance Gm.

Therefore, the variable gain amplifier of FIG. 9 has a linear dB gain. Since the variable gain amplifier of FIG. 9 operates in the same manner as the variable gain amplifier of FIG. 7, description of the operation of the variable gain amplifier of FIG. 9 will not be repeated.

As described above, the variable gain amplifier according to the exemplary embodiments of the present invention has an exponentially varying transconductance by linearly adjusting the gate voltage of the MOS transistor used for a variable resistor. Therefore, the variable gain amplifier according to the present invention has linear-in-decibel transconductance.

While the exemplary embodiments of the present invention and their advantages have been described in detail, it should be understood that various changes, substitutions and alterations may be made herein without departing from the scope of the invention.

What is claimed is:

1. A variable gain amplifier comprising:

a first MOS transistor having a gate to which a positive differential input signal is applied, and having a drain coupled to a first output node;

a first current source, coupled between a source of the first MOS transistor and a ground, configured to provide a first current;

a second MOS transistor having a gate to which the positive differential input signal is applied, and having a drain coupled to a second output node;

a third MOS transistor having a gate to which a negative differential input signal is applied, and having a drain coupled to the first output node;

a second current source, coupled between the ground and a junction of a source of the second MOS transistor and a source of the third MOS transistor, and configured to provide a second current I;

a fourth MOS transistor having a gate to which the negative differential input signal is applied, and having a drain coupled to the second output node;

a third current source, coupled between a source of the fourth MOS transistor and the ground, and configured to provide a third current 2×I; and a variable resistor coupled between the first MOS transistor and the fourth MOS transistor; wherein the first current is defined as 2×I.

2. The variable gain amplifier of claim 1, further comprising:
a first load resistor coupled between a power supply voltage and the first output node; and
a second load resistor coupled between the power supply voltage and the second output node.

3. The variable gain amplifier of claim 1, wherein transconductance values of the second MOS transistor and the third MOS transistor are approximately equal to each other, and transconductance values of the first MOS transistor and the fourth MOS transistor are about two times as large as a transconductance value of the second MOS transistor.

4. The variable gain amplifier of claim 1, wherein the variable resistor is implemented using at least one MOS transistor.

5. The variable gain amplifier of claim 4, wherein the at least one MOS transistor implemented as the variable resistor operates in a linear region.

6. The variable gain amplifier of claim 4, wherein the variable gain amplifier has an exponentially varying transconductance responsive to adjusting a control voltage applied to a gate of the at least one MOS transistor.

7. The variable gain amplifier of claim 1, wherein the first, second, third and fourth MOS transistors have approximately the same transistor size.

8. A variable gain amplifier comprising:
a first MOS transistor having a gate to which a positive differential input signal is applied and having a drain coupled to a first output node, the first MOS transistor having a size of 4×W/L, W representing a width of a channel of the first MOS transistor, and L representing a length of the channel;
a first current source, coupled between a source of the first MOS transistor and a ground, and configured to provide a current I;
a second MOS transistor having a gate to which the positive differential input signal is applied and having a drain coupled to a second output node, and the second MOS transistor having a size of 1 W/L;
a third MOS transistor having a gate to which a negative differential input signal is applied and having a drain coupled to the first output node, and the third MOS transistor having the size of 1 W/L;
a second current source, coupled between the ground and a junction of a source of the second MOS transistor and a source of the third MOS transistor, and configured to provide a current 2×I;
a fourth MOS transistor having a gate to which the negative differential input signal is applied and having a drain coupled to the second output node, and the fourth MOS transistor having a size of 4×W/L;
a third current source, coupled between a source of the fourth MOS transistor and the ground, and configured to provide the current I; and
a variable resistor coupled between the first MOS transistor and the fourth MOS transistor.

9. The variable gain amplifier of claim 8, further comprising:
a first load resistor coupled between a power supply voltage and the first output node; and
a second load resistor coupled between the power supply voltage and the second output node.

10. The variable gain amplifier of claim 8, wherein transconductance values of the second MOS transistor and the third MOS transistor are approximately equal to each other, and transconductance values of the first MOS transistor and the fourth MOS transistor are about two times as large as the transconductance value of the second MOS transistor.

11. The variable gain amplifier of claim 8, wherein the variable resistor is implemented using at least one MOS transistor.

12. The variable gain amplifier of claim 11, wherein the at least one MOS transistor implemented as the variable resistor operates in a linear region.

13. The variable gain amplifier of claim 11, wherein the variable gain amplifier has an exponentially varying transconductance responsive to adjusting a control voltage applied to a gate of the at least one MOS transistor implemented as the variable resistor.

* * * * *